(12) United States Patent
Inaba et al.

(10) Patent No.: US 10,680,128 B2
(45) Date of Patent: Jun. 9, 2020

(54) SOLAR PANEL

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Hirotaka Inaba, Kariya (JP); Motoya Sakabe, Nisshin (JP); Kazuyoshi Ogata, Toyota (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/196,432

(22) Filed: Nov. 20, 2018

(65) Prior Publication Data

US 2019/0165194 A1 May 30, 2019

(30) Foreign Application Priority Data

Nov. 24, 2017 (JP) ................................. 2017-226200

(51) Int. Cl.
*H01L 31/05* (2014.01)
*H02S 40/36* (2014.01)
(Continued)

(52) U.S. Cl.
CPC ...... *H01L 31/0508* (2013.01); *H01L 31/0201* (2013.01); *H01L 31/02008* (2013.01);
(Continued)

(58) Field of Classification Search
CPC ... H01L 31/048; H01L 31/05; H01L 31/0504; H01L 31/0508; H01L 31/0516;
(Continued)

(56) References Cited

U.S. PATENT DOCUMENTS

| 2010/0229923 A1* | 9/2010 | Frolov | H01L 31/0392 |
| | | | 136/251 |
| 2014/0124013 A1* | 5/2014 | Morad | H01L 31/0504 |
| | | | 136/246 |

(Continued)

FOREIGN PATENT DOCUMENTS

| EP | 2 922 197 A1 | 9/2015 |
| JP | 2017-034004 A | 2/2017 |

(Continued)

*Primary Examiner* — Lindsey A Bernier
(74) *Attorney, Agent, or Firm* — Sughrue Mion, PLLC (57) ABSTRACT

A solar panel includes conductors each having a first base portion, which is connected to a third base portion with a first connecting portion, and a second base portion, which is connected to the third base portion with a second connecting portion. Output leads include a distal end portion and an extending portion. The distal end portion extends in a first direction along a second front surface of a back cover and is connected to the third base portion from the side opposite from a solar cell. The extending portion is continuous with the distal end portion and extends in a first direction toward the solar cell along a second back surface of the back cover. The first connecting portion and the second connecting portion are elastically deformable in the first direction and a second direction, which intersects the first direction.

6 Claims, 8 Drawing Sheets

(51) Int. Cl.
  *H01L 31/048* (2014.01)
  *H01L 31/02* (2006.01)
  *H01L 31/049* (2014.01)

(52) U.S. Cl.
  CPC ...... *H01L 31/02013* (2013.01); *H01L 31/048* (2013.01); *H01L 31/049* (2014.12); *H01L 31/05* (2013.01); *H02S 40/36* (2014.12)

(58) Field of Classification Search
  CPC ........... H01L 31/0201; H01L 31/02013; H01L 31/049; H02S 40/30; H02S 40/34; H02S 40/36
  See application file for complete search history.

(56) References Cited

U.S. PATENT DOCUMENTS

2015/0381109 A1* 12/2015 Choi .................. H01L 31/0201
                                                                    136/251
2017/0092795 A1    3/2017 Inaba et al.

FOREIGN PATENT DOCUMENTS

| JP | 2017-69249 A | 4/2017 |
| JP | 2017-79241 A | 4/2017 |
| WO | 2013018533 A1 | 2/2013 |
| WO | 2017/175748 A1 | 10/2017 |

\* cited by examiner

SOLAR PANEL

BACKGROUND

The present disclosure relates to a solar panel.

Japanese Laid-Open Patent Publication No. 2017-34004 discloses a conventional solar panel that includes a protective cover, a back cover, solar cells, conductors, a sealing member, and output leads.

The protective cover is made of glass and has light transparency allowing light to pass through from a first front surface of the protective cover to a first back surface of the protective cover. The back cover is made of plastic and includes a second front surface, which is joined to the sealing member, and a second back surface, which is located on the opposite side to the second front surface. The back cover includes through-holes that extend from the second front surface of the back cover to the second back surface of the back cover. The through-holes allow the output leads to be inserted. The solar cells are arranged in a grid pattern in a first direction and a second direction, which intersects the first direction. The conductors are formed into a tabular shape and extend in the second direction. The conductors are each located on the outer side of one of the two solar cells at the opposite ends of the array of the solar cells arranged in the first direction. The solar cell and the conductor that are located adjacent to each other in the first direction are connected to each other to permit electricity to flow therebetween.

The sealing member retains all the solar cells and all the conductors in a sealed state between the protective cover and the back cover. The sealing member also includes through-holes that allow the output leads to be inserted. Each output lead includes a distal end portion and an extending portion. The distal end portion is arranged along the second front surface of the back cover and is connected to the corresponding conductor at a position different from where the solar cell is connected. The extending portion connected to the distal end passes through the through-holes of the sealing member and the back cover, extends to the second back surface of the back cover, and is connected to a terminal box.

The solar panel allows the electric power generated by the solar cells to be transmitted to the terminal box through the output leads connected to the solar cells.

In the above-described conventional solar panel, even if the back cover expands in the second direction due to thermal expansion during manufacturing or use, the conductors resist being expanded in the second direction and are unlikely to conform to the back cover since the conductors are formed into a tabular shape. Thus, the solar cells and the conductors are displaced relative to each other in the second direction, and the connections among the solar cells, the conductors, and the output leads that permit electricity to flow are likely to break.

Furthermore, in the solar panel, when the back cover thermally expands, the output leads follow the back cover and move in the first direction away from the solar cells. Thus, stress acts on the connection parts between the distal ends of the output leads and the conductors in a direction of peeling the distal ends of the output leads off the conductors. Thus, in the solar panel, the distal ends of the output leads are easily peeled off the conductors. For these reasons, the solar panel is likely to cause electrical continuity failure due to thermal expansion. In particular, in recent years, the protective cover may be made of plastic from the viewpoint of reducing the weight. However, since such a protective cover has a thermal expansion coefficient greater than that of the glass protective cover, the above-described problem becomes more noticeable in the solar panel with the protective cover and the back cover both made of plastic.

SUMMARY

Accordingly, it is an objective of the present disclosure to provide a solar panel that is capable of inhibiting the occurrence of electrical continuity failure due to thermal expansion while employing a protective cover and a back cover that are made of plastic.

In accordance with one aspect of the present disclosure, a solar panel is provided that includes a plastic protective cover having light transparency allowing light to pass through from a first front surface to a first back surface, a plastic back cover, a solar cell, a conductor, which is arranged next to the solar cell in a first direction and is connected to the solar cell to permit electricity to flow therebetween, a sealing member, which retains the solar cell and the conductor between the protective cover and the back cover in a sealed state, and a plurality of output leads configured to transmit electricity generated by the solar cell. The back cover includes a second front surface joined to the sealing member and a second back surface located on an opposite side to the second front surface. The conductor includes a first base portion, a second base portion, a third base portion located between the first base portion and the second base portion, a first connecting portion, and a second connecting portion. The first base portion is secured to at least one of the protective cover and the back cover, is arranged next to the solar cell in the first direction, and is connected to the solar cell. The second base portion is located at a position away from the first base portion in a second direction, which intersects the first direction, is secured to at least one of the protective cover and the back cover, is arranged next to the solar cell in the first direction, and is connected to the solar cell. The first connecting portion is located between the first base portion and the third base portion and connects the first base portion to the third base portion. The second connecting portion is located between the second base portion and the third base portion and connects the second base portion to the third base portion. Each output lead includes a disstal end portion, which extends in the first direction along the second front surface and is connected to the third base portion from a side opposite from the solar cell, and an extending portion, which is continuous with the distal end portion and extends in the first direction toward the solar cell along the second back surface. At least part of the extending portion is secured to the second back surface. Each of the first connecting portion and the second connecting portion is elastically deformable in the first and second directions.

In accordance with another aspect of the present disclosure, a solar panel is provided that includes a plastic protective cover having light transparency allowing light to pass through from a first front surface to a first back surface, a plastic back cover, a solar cell, a conductor, which is arranged next to the solar cell in a first direction and is connected to the solar cell to permit electricity to flow therebetween, a sealing member, which retains the solar cell and the conductor between the protective cover and the back cover in a sealed state, and an output lead configured to transmit electricity generated by the solar cell. The back cover includes a second front surface joined to the sealing member and a second back surface located on an opposite side to the second front surface. The solar cell is secured to at least one of the protective cover and the back cover. The conductor includes a first base portion, a second base portion, a third base portion located between the first base portion and the second base portion, a first connecting portion, and a second connecting portion. The first base portion is arranged next to the solar cell in the first direction and is connected to the solar cell. The second base portion is located at a position away from the first base portion in a second direction, which intersects the first direction, is arranged next to the solar cell in the first direction, and is connected to the solar cell. The first connecting portion is located between the first base portion and the third base portion and connects the first base portion to the third base portion. The second connecting portion is located between the second base portion and the third base portion and connects the second base portion to the third base portion. The output lead includes a distal end portion, which extends in the first direction along the second front surface and is connected to the third base portion from a side opposite from the solar cell, and an extending portion, which is continuous with the distal end portion and extends in the first direction toward the solar cell along the second back surface. At least part of the extending portion is secured to the second back surface. Each of the first connecting portion and the second connecting portion is elastically deformable in the first and second directions.

Other aspects and advantages of the present disclosure will become apparent from the following description, taken in conjunction with the accompanying drawings, illustrating exemplary embodiments.

BRIEF DESCRIPTION OF THE DRAWINGS

The disclosure may be understood by reference to the following description together with the accompanying drawings.

DETAILED DESCRIPTION

First to third embodiments of the present disclosure will now be described with reference to the drawings.

First Embodiment

Figure 1:
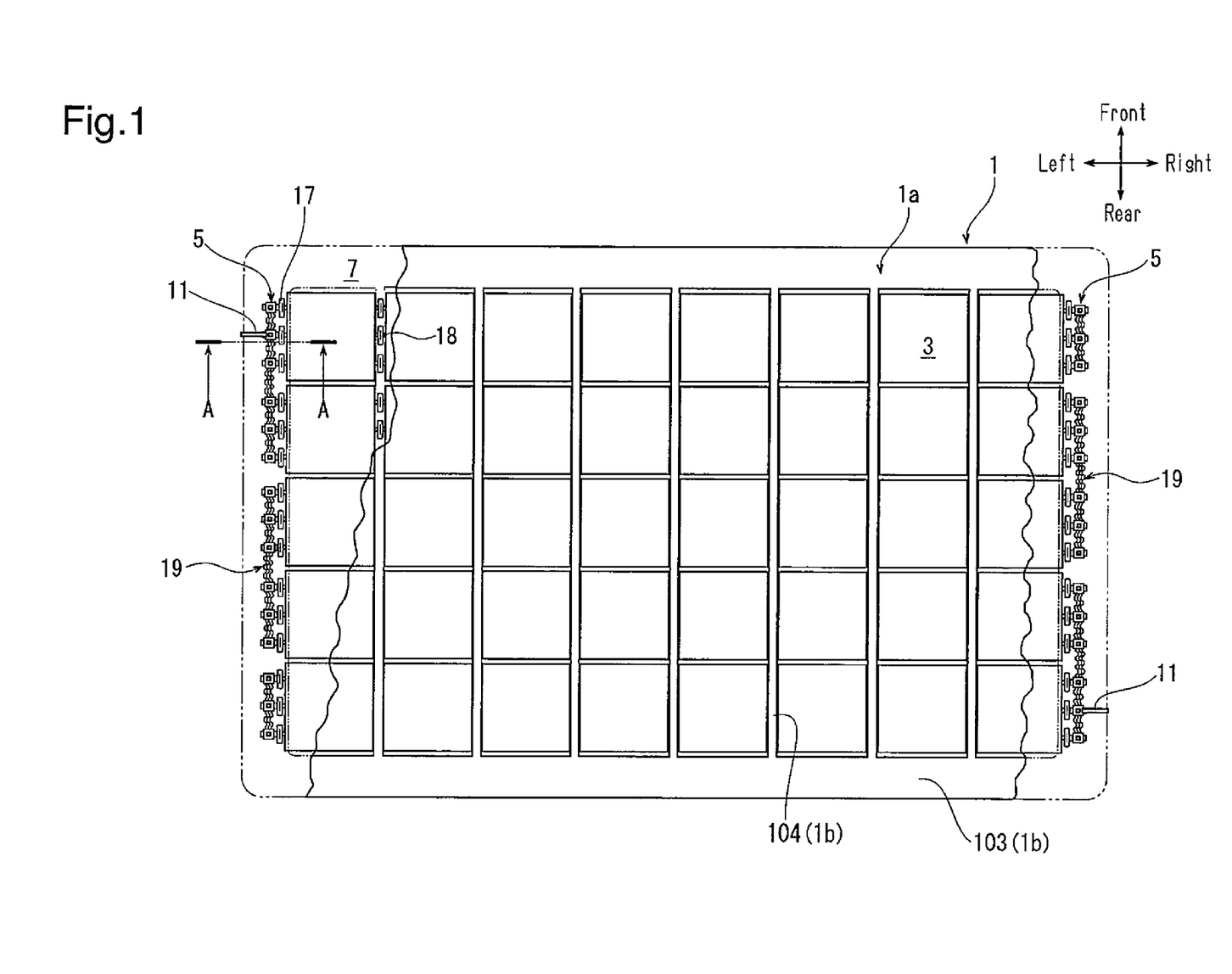
FIG. 1 is a top view of a solar panel according to a first embodiment.
Figure 2:
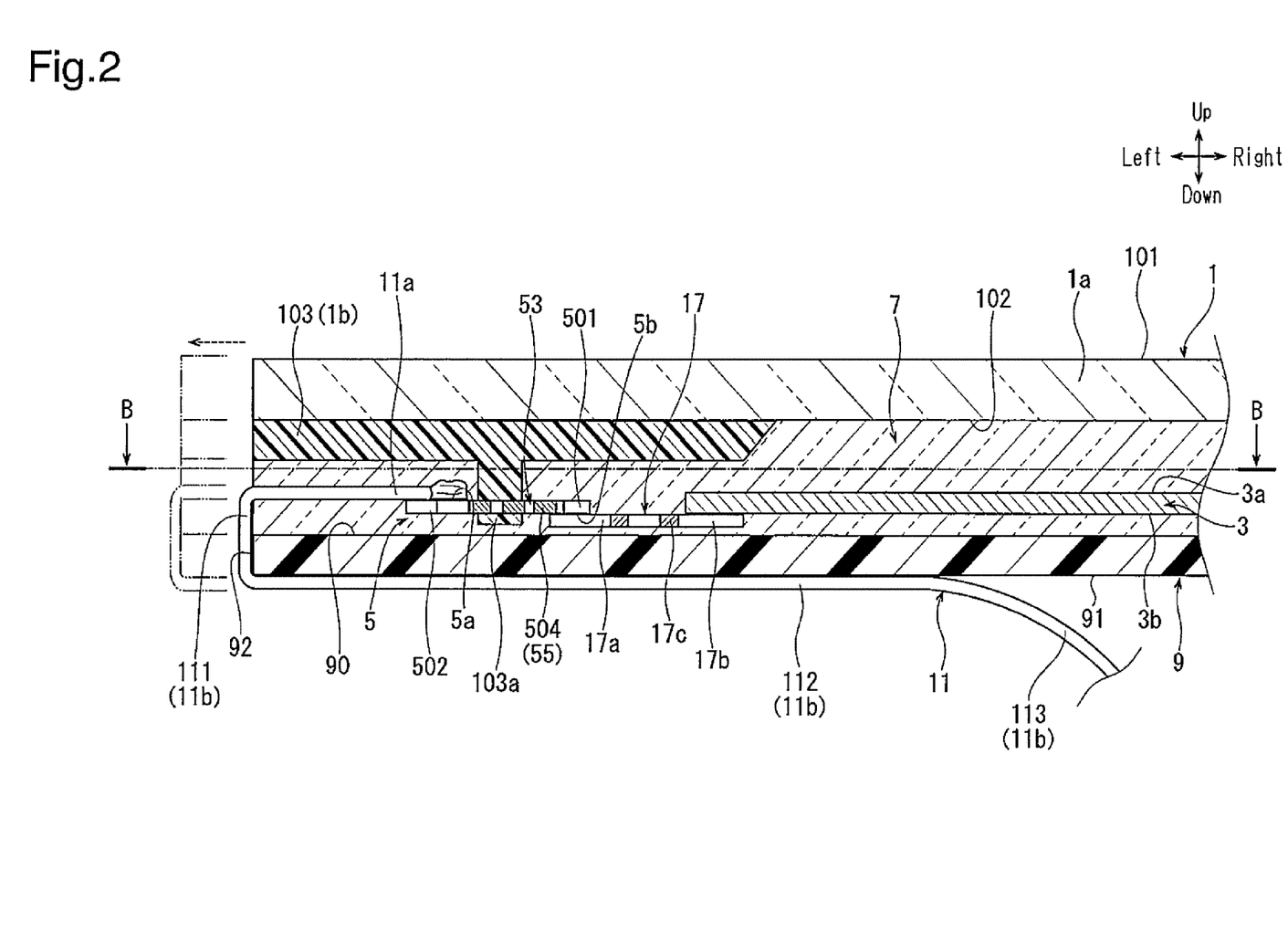
FIG. 2 is an enlarged cross-sectional view taken along line A-A of FIG. 1 of the solar panel according to the first embodiment.

As shown in FIG. 1, a solar panel according to a first embodiment includes a protective cover 1, solar cells 3, conductors 5, a sealing member 7, two output leads 11, and a back cover 9 shown in FIG. 2. The solar panel is employed in a non-illustrated vehicle. To facilitate description, FIG. 1 omits illustration of parts of the protective cover 1 by cutting away parts of the protective cover 1.

Figure 4:
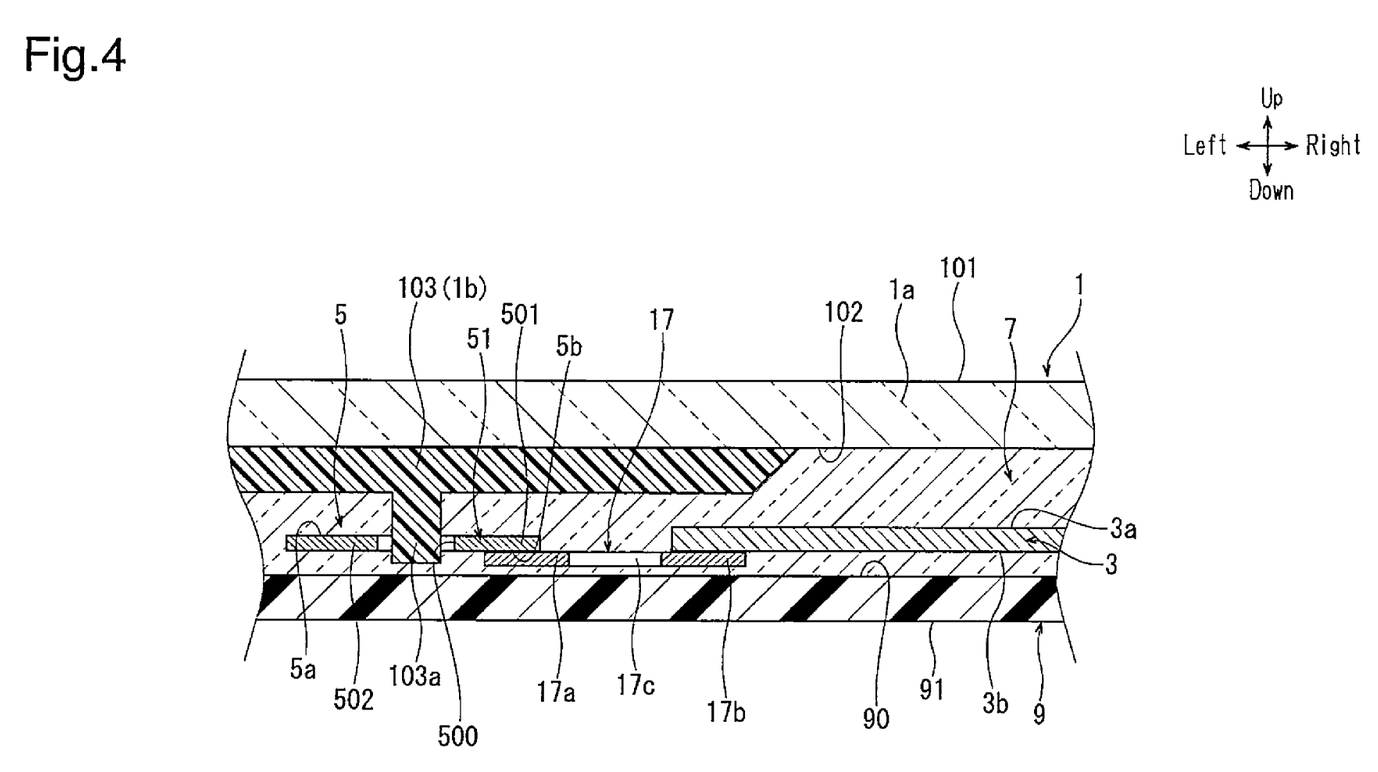
FIG. 4 is an enlarged cross-sectional view taken along line C-C of FIG. 3 of the solar panel according to the first embodiment.

In the present embodiment, the lateral direction of the solar panel is defined as follows. The direction indicated as LEFT in FIG. 1 is defined as the leftward direction of the solar panel, and the direction indicated as RIGHT in FIG. 1 is defined as the rightward direction of the solar panel. Furthermore, the front-rear direction of the solar panel is defined as follows. The direction indicated as FRONT in FIG. 1 is defined as the forward direction of the solar panel, and the direction indicated as REAR in FIG. 1 is defined as the rearward direction of the solar panel. FIG. 2 and the following figures show the left, right, front, and rear directional axes corresponding to FIG. 1. Furthermore, the vertical direction of the solar panel, that is, the thickness direction of the solar panel is defined as follows. The direction indicated as UP in FIGS. 2 and 4 is defined as the upward direction of the solar panel, and the direction indicated as DOWN is defined as the downward direction of the solar panel. The lateral direction, the front-rear direction, and the vertical direction are orthogonal to one another. The lateral direction of the solar panel is an example of a first direction of the present disclosure, and the front-rear direction of the solar panel is an example of a second direction of the present disclosure. These directions are examples used for convenience of description and are irrelevant to the directions during use of the solar panel.

As shown in FIG. 2, the protective cover 1 includes a cover main body 1a and a concealing member 1b. The cover main body 1a is formed of transparent plastic that mainly contains polycarbonate and has light transparency allowing light to pass through from a first front surface 101 to a first back surface 102. The first front surface 101 constitutes a surface of the solar panel, that is, an ornamental surface of the solar panel. The first front surface 101 and the first back surface 102 are shaped flat. Thus, as shown in FIG. 1, the cover main body 1a, and thus, the protective cover 1 is formed into a substantially rectangular tabular shape. The cover main body 1a may be formed into, for example, a curved shape that bulges from the first back surface 102 toward the first front surface 101.

The concealing member 1b is formed of plastic that mainly contains polycarbonate colored in, for example, opaque black. As shown in FIG. 2, the concealing member 1b is injection molded on the first back surface 102 of the cover main body 1a and is integrated with the first back surface 102. The cover main body 1a and the concealing member 1b may be formed of plastic that mainly contains material other than polycarbonate. Alternatively, the protective cover 1 may be constituted by only the cover main body 1a.

Figure 3:
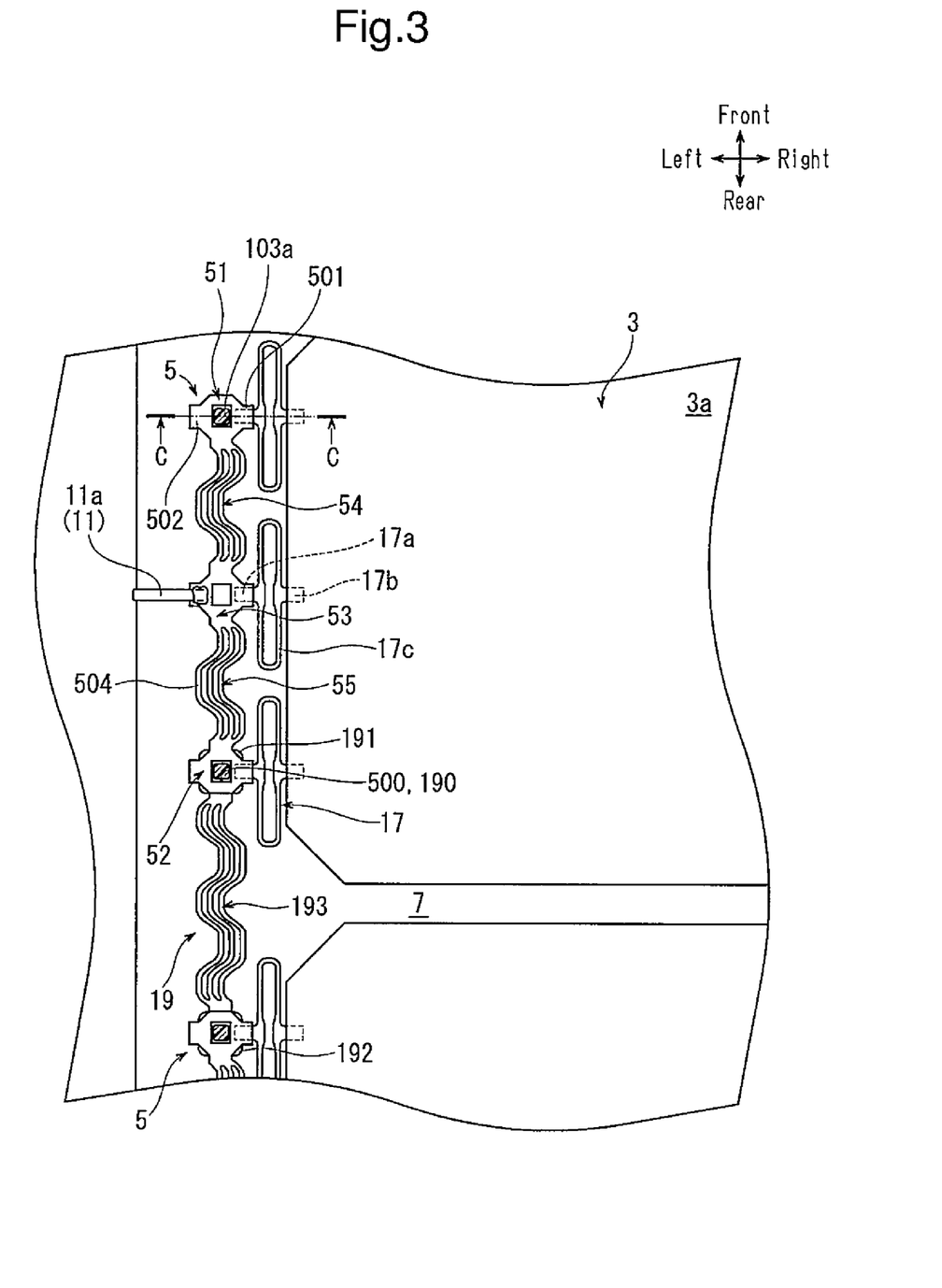
FIG. 3 is an enlarged cross-sectional view taken along line B-B of FIG. 2 of the solar panel according to the first embodiment.

As shown in FIG. 1, the concealing member 1b includes a peripheral portion 103 and coupling portions 104. The peripheral portion 103 is formed along the outer edge of the cover main body 1a and resembles a frame surrounding all the solar cells 3. The peripheral portion 103 covers the conductors 5 arranged at the left end and the conductors 5 arranged at the right end so that when one looks at the first front surface 101 of the cover main body 1a, these conductors 5 cannot be seen. Furthermore, as shown in FIGS. 2 to 4, bosses 103a are formed on the left edge portion of the peripheral portion 103. As shown in FIG. 3, the bosses 103a are aligned in the front-rear direction with predetermined gaps. As shown in FIGS. 2 and 4, each boss 103a projects downward from the peripheral portion 103 toward the back cover 9. Although not shown, the bosses 103a are also formed on the right edge portion of the peripheral portion 103 in the same manner.

As shown in FIG. 1, the coupling portions 104 are located inward of the peripheral portion 103 and extend in the front-rear direction of the cover main body 1a. Each coupling portion 104 covers interconnectors 18 provided between the solar cells 3 so that when one looks at the first front surface 101, these interconnectors 18 cannot be seen.

The back cover 9 shown in FIG. 2 is formed of plastic that mainly contains polycarbonate. The back cover 9 is formed into a flat plate corresponding to the shape of the protective cover 1. The back cover 9 is formed into a size equal to that of the protective cover 1. The back cover 9 includes a second front surface 90 and a second back surface 91. The second front surface 90 faces the first back surface 102 and is joined to the sealing member 7. The second back surface 91 is located on the opposite side to the second front surface 90. The second back surface 91 constitutes the back surface of the solar panel. The back cover 9 may be formed of plastic that mainly contains material other than polycarbonate. The back cover 9 may be formed to be smaller than the protective cover 1.

The solar cells 3 shown in FIG. 1 employ crystalline silicon. All the solar cells 3 have the same structure and deliver the same performance. The solar cells 3 are arranged in a grid pattern in the front-rear direction and the lateral direction of the solar panel. As shown in FIGS. 2 and 4, each solar cell 3 is a thin film and includes a front surface 3a and a back surface 3b. Electrical continuity parts (not shown) are provided at the left and right ends of the back surface 3b of each solar cell 3. The electrical continuity parts may be provided on the front surface 3a. The size and the number of the solar cells 3 can be changed as required in accordance with the size of the solar panel.

As shown in FIG. 1, the multiple conductors 5 are located on each of the left edge and the right edge of the solar panel. The conductors 5 located on the left edge of the solar panel are symmetrical with the conductors 5 located on the right edge of the solar panel. Hereinafter, the structure of the conductors 5 will be described in detail using some of the conductors 5 located on the left edge of the solar panel.

Figure 5:
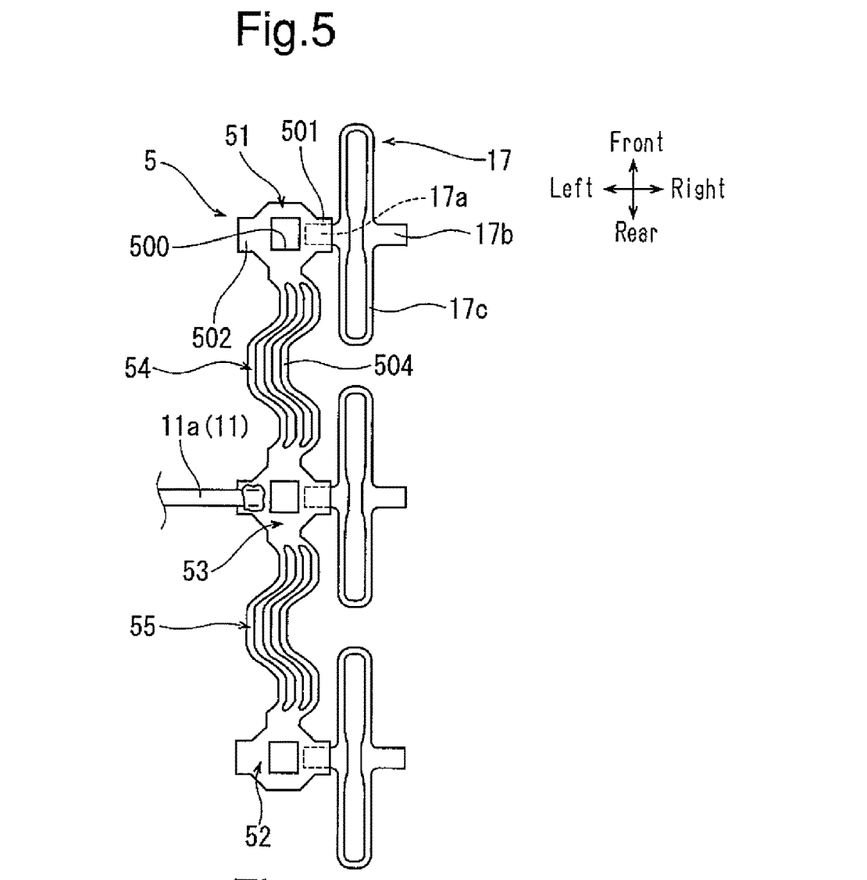
FIG. 5 is a top view of the conductors and the output lead in the solar panel according to the first embodiment.

The conductors 5 are formed by punching a metal sheet. As shown in FIG. 5, each conductor 5 includes a first base portion 51, a second base portion 52, a third base portion 53, a first connecting portion 54, and a second connecting portion 55.

The first base portion 51 is a front section of the conductor 5. The second base portion 52 is a rear section of the conductor 5. That is, in the conductor 5, the first base portion 51 and the second base portion 52 are located with a constant gap in the front-rear direction. The third base portion 53 is located between the first base portion 51 and the second base portion 52. The first to third base portions 51 to 53 are aligned in the front-rear direction. The first to third base portions 51 to 53 are shaped substantially rectangular as viewed from the top. A through-hole 500 is formed at the center of each of the first to third base portions 51 to 53. Furthermore, each of the first to third base portions 51 to 53 includes a first connecting section 501, which extends rightward from the perimeter of the through-hole 500, and a second connecting section 502, which extends leftward from the perimeter of the through-hole 500. The third base portion 53 does not necessarily need to have the through-hole 500.

The first connecting portion 54 and the second connecting portion 55 are each constituted by three connecting bodies 504. Each connecting body 504 is shaped like a narrow line as viewed from the top. More specifically, each connecting body 504 curves in a manner resembling a waveform with a constant amplitude in the lateral direction and extends in the front-rear direction. The three connecting bodies 504 are arranged with constant gaps in the lateral direction. The number of the connecting bodies 504 constituting the first connecting portion 54 and the second connecting portion 55 can be changed as required.

The first connecting portion 54 is located between the first base portion 51 and the third base portion 53 and connects the first base portion 51 to the third base portion 53. The second connecting portion 55 is located between the second base portion 52 and the third base portion 53 and connects the second base portion 52 to the third base portion 53. In this embodiment, the connecting bodies 504 elastically deform in the front-rear direction to allow the first and second connecting portions 54, 55 to elastically deform in the front-rear direction. Furthermore, the connecting bodies 504 elastically deform in the lateral direction to allow the first and second connecting portions 54, 55 to elastically deform in the lateral direction.

Each of the first to third base portions 51 to 53 includes an interconnector 17. The interconnector 17 is formed by punching a metal sheet in the same manner as the conductors 5. The interconnector 17 includes a first electrode 17a, a second electrode 17b, and a connecting portion 17c. The connecting portion 17c is ring shaped as viewed from the top. The first electrode 17a is a section that projects leftward from the connecting portion 17c, and the second electrode 17b is a section that projects rightward from the connecting portion 17c. The first and second electrodes 17a, 17b are each formed into a rectangular tabular shape as viewed from the top. The connecting portion 17c connects the first electrode 17a and the second electrode 17b to each other to permit electricity to flow therebetween. The connecting portion 17c elastically deforms to allow the gap between the first electrode 17a and the second electrode 17b to be changed in the lateral direction. For example, the first electrode 17a, the second electrode 17b, and the connecting portion 17c may be formed by bending a metal plate.

As shown in FIG. 4, the first electrode 17a of the interconnector 17 is connected to a back surface 5b of the first connecting section 501. The same applies to the second and third base portions 52, 53. The second electrode 17b of the interconnector 17 is connected to the electrical continuity part located on the left section of the back surface 3b of the adjacent solar cell 3. In this manner, as shown in FIG. 1, the conductors 5 located on the left edge of the solar panel are connected to the solar cells 3 located at the leftmost end among the solar cells 3 arranged in a grid pattern to permit electricity to flow. The conductors 5 arranged on the left edge of the solar panel are aligned in the front-rear direction. Similarly, the conductors 5 located on the right edge of the solar panel are connected to the solar cells 3 located at the rightmost end to permit electricity to flow. The conductors 5 located on the right edge of the solar panel are aligned in the front-rear direction. Furthermore, the two solar cells 3 adjacent to each other in the lateral direction are connected to each other by three interconnectors 18. The interconnectors 18 have the same structure as the interconnectors 17.

Figure 6:
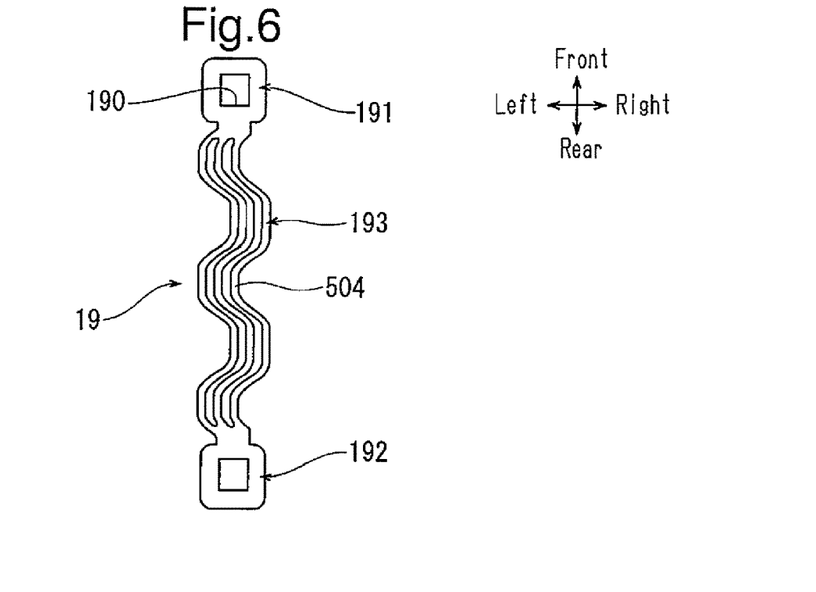
FIG. 6 is a top view of the auxiliary conductor in the solar panel according to the first embodiment.

Furthermore, as shown in FIG. 3, an auxiliary conductor 19 is provided as required between two conductors 5 located adjacent to each other in the front-rear direction so that the solar cells 3 located in a grid pattern are connected in series. The auxiliary conductors 19 are also formed by punching a metal sheet in the same manner as the conductors 5. As shown in FIG. 6, each auxiliary conductor 19 includes a fourth base portion 191, a fifth base portion 192, and a third connecting portion 193.

The fourth base portion 191 is a front section of the auxiliary conductor 19. The fifth base portion 192 is a rear section of the auxiliary conductor 19. The fourth base portion 191 and the fifth base portion 192 are aligned in the front-rear direction. Furthermore, fourth base portion 191 and the fifth base portion 192 are formed into a substantially rectangular shape as viewed from the top and each include a through-hole 190 at the center. The third connecting portion 193 is constituted by connecting bodies 504. The third connecting portion 193 has a length longer than that of the first and second connecting portions 54, 55 in the front-rear direction. The length of the third connecting portion 193 in the front-rear direction is determined based on the distance between the two conductors 5 arranged in the front-rear direction.

The third connecting portion 193 is located between the fourth base portion 191 and the fifth base portion 192 and connects the fourth base portion 191 to the fifth base portion 192. Furthermore, in the auxiliary conductor 19 also, the third connecting portion 193 is elastically deformable in the front-rear direction and the lateral direction.

As shown in FIG. 3, the fourth base portion 191 of the auxiliary conductor 19 is connected to the second base portion 52 of the conductor 5 located forward of the auxiliary conductor 19. The fifth base portion 192 of the auxiliary conductor 19 is connected to the first base portion 51 of the conductor 5 located rearward of the auxiliary conductor 19. At this time, the fourth base portion 191 and the second base portion 52 are connected to each other with the through-hole 190 and the through-hole 500 aligned with each other. The same applies to the fifth base portion 192 and the first base portion 51. In this manner, the auxiliary conductor 19 connects one of the conductors 5 located forward to another one of the conductors 5 located rearward.

As shown in FIG. 4, in each conductor 5, the through-hole 500 of the first base portion 51 receives the associated boss 103a. As shown in FIG. 3, the through-hole 500 of the second base portion 52 also receives the associated boss 103a in the same manner. Note that the boss 103a is inserted in the through-hole 500 and the through-hole 190 in the case with the second base portion 52 to which the fourth base portion 191 is connected and with the first base portion 51 to which the fifth base portion 192 is connected. In this manner, the first and second base portions 51, 52 and the fourth and fifth base portions 191, 192 are positioned with respect to the protective cover 1 using the bosses 103a and are secured to, or more specifically, directly secured to the protective cover 1. That is, the base portions 51, 52, 191, 192 are secured to the protective cover 1 so as not to be displaced with respect to the protective cover 1. In contrast, no boss 103a is inserted in the through-hole 500 of the third base portion 53 of each conductor 5. Thus, the third base portion 53 is not secured to the protective cover 1. That is, there is no securing structure between the third base portion 53 and the protective cover 1 that secures the relative position of the third base portion 53 and the protective cover 1. The bosses 103a may be formed on the second front surface 90 of the back cover 9, so that the first and second base portions 51, 52 and the fourth and fifth base portions 191, 192 are positioned with respect to the back cover 9 and are secured to the back cover 9. Furthermore, the bosses 103a may be formed on both the peripheral portion 103 and the second front surface 90, so that the first and second base portions 51, 52 and the fourth and fifth base portions 191, 192 are secured to the protective cover 1 and the back cover 9. That is, the base portions 51, 52, 191, 192 may be secured to at least one of the protective cover 1 and the back cover 9 so as not to be displaced with respect to at least one of the protective cover 1 and the back cover 9.

The sealing member 7 shown in FIG. 2 is made of ethylene-vinyl acetate copolymer (EVA). The sealing member 7 is joined to the first back surface 102 of the cover main body 1a and the second front surface 90 of the back cover 9. Thus, the sealing member 7 retains all of the solar cells 3, the conductors 5, the interconnectors 18, and distal end portions 11a of the output leads 11, which will be discussed below, in a sealed state between the protective cover 1 and the back cover 9. In this manner, the sealing member 7 protects the solar cells 3 and other components from deteriorating due to water and oxygen. The sealing member 7 may be made of, for example, an ionomer resin, a silicone resin, or polyolefin instead of the EVA.

As shown in FIG. 1, the output leads 11 are located one each at the left end and the right end of the solar panel. The output leads 11 are arranged to be symmetrical. Hereinafter, the structure of the output lead 11 located at the left end of the solar panel will be described in detail.

As shown in FIG. 2, the output lead 11 includes the distal end portion 11a and an extending portion 11b. The distal end portion 11a extends in the sealing member 7, that is, along the second front surface 90 of the back cover 9. The distal end portion 11a is connected to the third base portion 53 of one of the conductors 5 provided on the left edge of the solar panel. More specifically, the distal end portion 11a is connected to a front surface 5a of the second connecting section 502 of the third base portion 53 by soldering. In this manner, the distal end portion 11a is connected to the third base portion 53 on the side opposite from the interconnector 17 and thus from the solar cells 3 and extends leftward from the third base portion 53. The distal end portion 11a may be connected to the second connecting section 502 by a method other than soldering. The distal end portion 11a may be connected to the back surface 5b of the second connecting section 502.

The extending portion 11b is constituted by a first section 111, a second section 112, and a third section 113. The first section 111 is continuous with the distal end portion 11a. The first section 111 is exposed to the outside of the sealing member 7 and extends toward the second back surface 91 of the back cover 9 along a left end surface 92 of the back cover 9. The second section 112 is continuous with the first section 111 and extends along the second back surface 91 of the back cover 9. The second section 112 extends from the left end surface 92 rightward toward the solar cells 3 along the second back surface 91. The third section 113 is continuous with the second section 112. The third section 113 is connected to a non-illustrated terminal box. The terminal box is connected to non-illustrated vehicle electrical components.

The second section 112 of the extending portion 11b is secured to the second back surface 91. Accordingly, the extending portion 11b and thus the output lead 11 are positioned with respect to the back cover 9. The second section 112 may be secured to the second back surface 91 with, for example, an adhesive. Alternatively, the second section 112 may be secured to the second back surface 91 by welding during manufacturing of the solar panel.

In the solar panel configured as described above, electric power generated by the solar cells 3 is transmitted to the terminal box through the output leads 11. Consequently, electric power generated by the solar cells 3 can be supplied to the vehicle electrical components through the terminal box.

Figure 7:
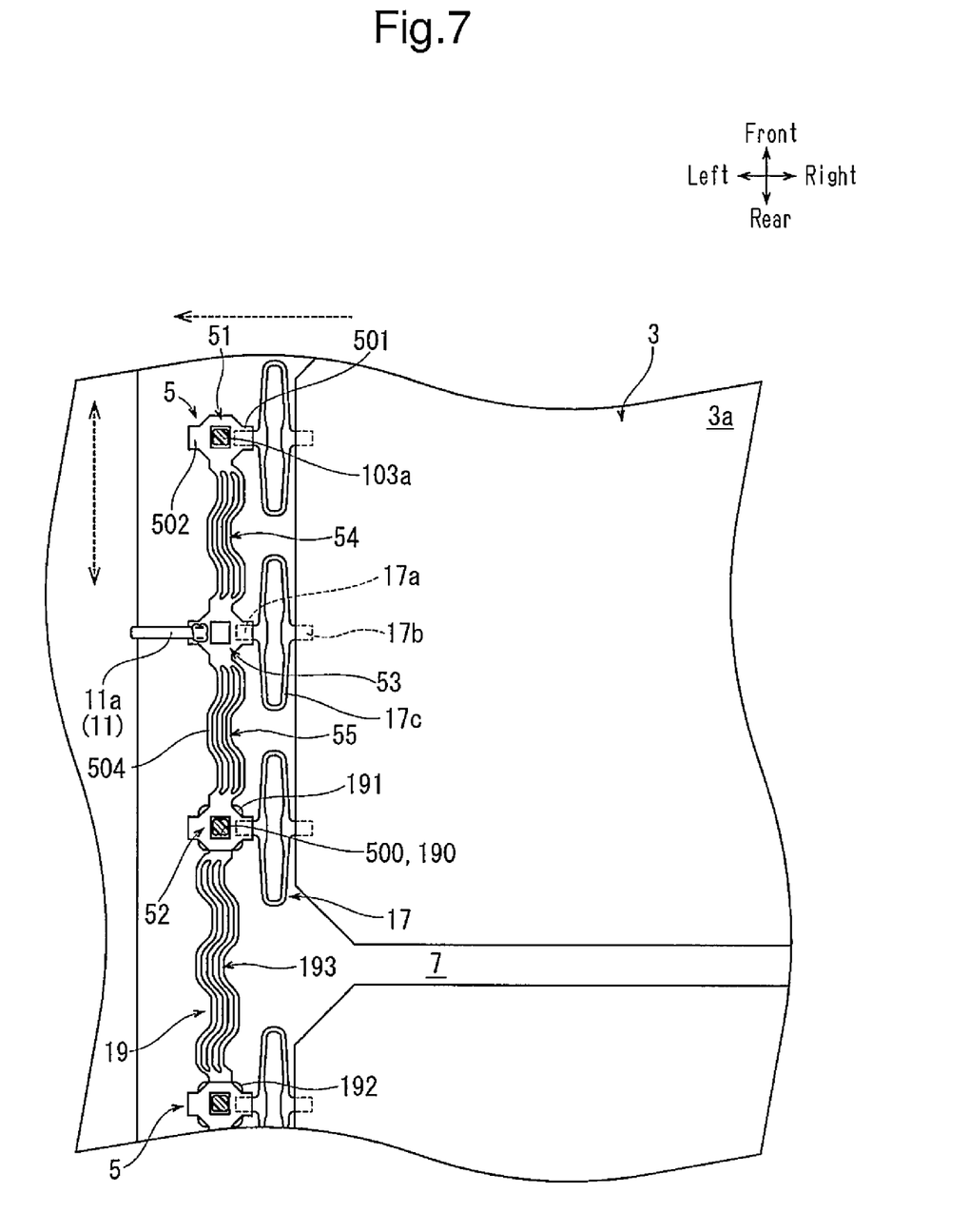
FIG. 7 is an enlarged cross-sectional view of the solar panel according to the first embodiment that is the same as FIG. 3 when the protective cover and the back cover are thermally expanded.

In the solar panel, the protective cover 1 and the back cover 9 expand in the front-rear direction and the lateral direction due to thermal expansion during manufacturing or use as indicated by dashed arrows in FIG. 7. Thus, the gap between two of the bosses 103a widens in the front-rear direction from the state shown in FIG. 3 to the state shown in FIG. 7 in the solar panel. The first base portion 51 and the second base portion 52 of each conductor 5 are secured to the protective cover 1 with the bosses 103a. For this reason, if the gap between two of the bosses 103a of the conductor 5 widens in the front-rear direction, the first connecting portion 54 and the second connecting portion 55 elastically deform in the front-rear direction accordingly. As a result, the gap between the first base portion 51 and the third base portion 53 and the gap between the second base portion 52 and the third base portion 53 widen in the front-rear direction. Furthermore, the third connecting portion 193 of the auxiliary conductor 19 elastically deforms in the front-rear direction, so that the gap between the fourth base portion 191 and the fifth base portion 192 widens in the front-rear direction. Consequently, in the conductor 5, the gap between the first base portion 51 and the second base portion 52, that is, the gap between the first base portion 51 and the third base portion 53 and the gap between the second base portion 52 and the third base portion 53 widen in the front-rear direction. In this manner, the conductors 5 and the auxiliary conductors 19 are capable of expanding in the front-rear direction in accordance with the expansion of the protective cover 1 and the back cover 9. Thus, even if the protective cover 1 and the back cover 9 are thermally expanded, the connection between the solar cells 3 and the conductors 5 and the connection between the conductors 5 and the output leads 11 that permit electricity to flow are unlikely to be disconnected.

In the solar panel, the first section 111 of the extending portion 11b extends toward the second back surface 91 of the back cover 9 along the left end surface 92 of the back cover 9, and the second section 112 of the extending portion 11b is secured to the second back surface 91. Thus, the output lead 11 moves in accordance with the thermal expansion of the protective cover 1 and the back cover 9. That is, as shown by the imaginary line in FIG. 2, the output lead 11 located at the left end of the solar panel moves leftward in accordance with the thermal expansion of the protective cover 1 and the back cover 9. Thus, the distal end portion 11a of the output lead 11 moves leftward away from the third base portion 53 and the solar cells 3. At this time, as shown in FIG. 7, the connecting portion 17c of the interconnector 17 elastically deforms in the first direction like a pantograph and widens the space between the first electrode 17a and the second electrode 17b in the lateral direction. Thus, the conductors 5 located on the left edge of the solar panel are capable of moving leftward (in the first direction) in accordance with the movement of the distal end portion 11a while keeping the connection between the first to third base portions 51 to 53 and the solar cells 3. Furthermore, the first and second connecting portions 54, 55 are also capable of being elastically deformed to bend leftward with respect to the first and second base portions 51, 52, so that the third base portion 53 is allowed to be displaced further leftward with respect to the first and second base portions 51, 52 (see FIG. 9). The conductors 5 located on the right edge of the solar panel operate in the same manner symmetrically.

As described above, in the solar panel, even if the output lead 11 moves due to thermal expansion of the protective cover 1 and the back cover 9, the connection part between the distal end portion 11a and the third base portion 53, that is, the soldered part is unlikely to receive stress in a direction of peeling off the third base portion 53. Thus, the distal end portion 11a is inhibited from peeling off the third base portion 53 in the solar panel.

As a result, the solar panel of the first embodiment is capable of inhibiting the occurrence of electrical continuity failure due to thermal expansion while employing the protective cover 1 and the back cover 9 that are made of plastic.

Second Embodiment

Figure 8:
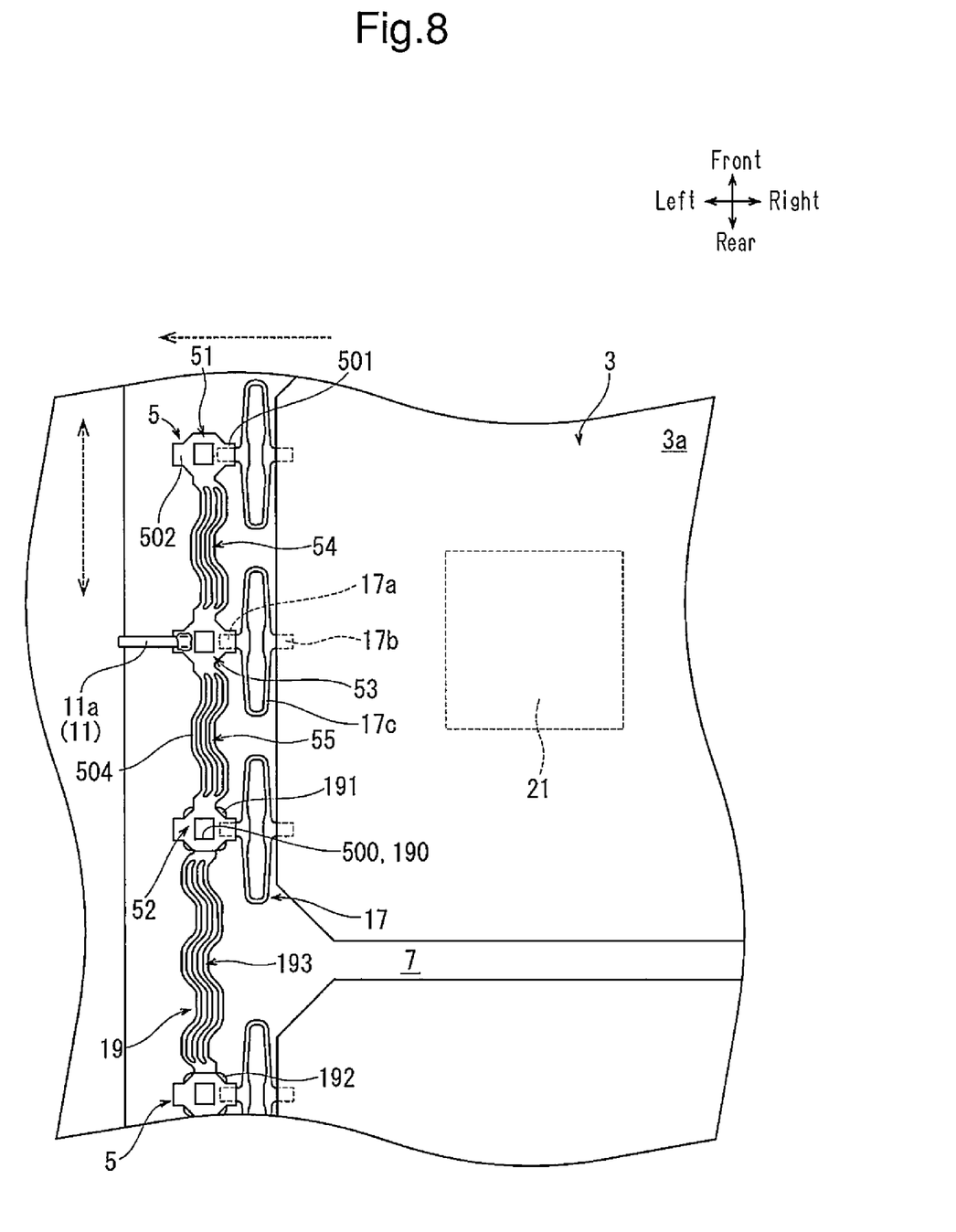
FIG. 8 is an enlarged cross-sectional view of a solar panel according to a second embodiment that is the same as FIG. 3 when the protective cover and the back cover are thermally expanded.

As shown in FIG. 8, a solar panel according to a second embodiment does not include the bosses 103a on the peripheral portion 103 of the concealing member 1b. Furthermore, in the solar panel of the second embodiment, a silicone resin 21 is provided between the solar cells 3 and the back cover 9. The solar cells 3 are secured to the back cover 9 with the silicone resin 21. The solar cells 3 may be secured to the back cover 9 with a material other than the silicone resin 21. Furthermore, the solar cells 3 may be secured to the cover main body 1a of the protective cover 1, or the solar cells 3 may be secured to the cover main body 1a and the back cover 9. That is, the solar cells 3 may be secured to at least one of the cover main body 1a and the back cover 9 so as not to be displaced with respect to at least one of the cover main body 1a and the back cover 9. Other structures of the solar panel of the second embodiment are the same as those of the solar panel according to the first embodiment, and like members are given like numbers and detailed explanations are omitted.

In the solar panel of the second embodiment, the first to third base portions 51 to 53 are connected to one of the solar cells 3 via the interconnectors 17, so that the first to third base portions 51 to 53 are secured to the back cover 9 via the solar cell 3. Thus, the solar panel of the second embodiment also operates in the same manner as the solar panel according to the first embodiment.

Third Embodiment

Figure 9:
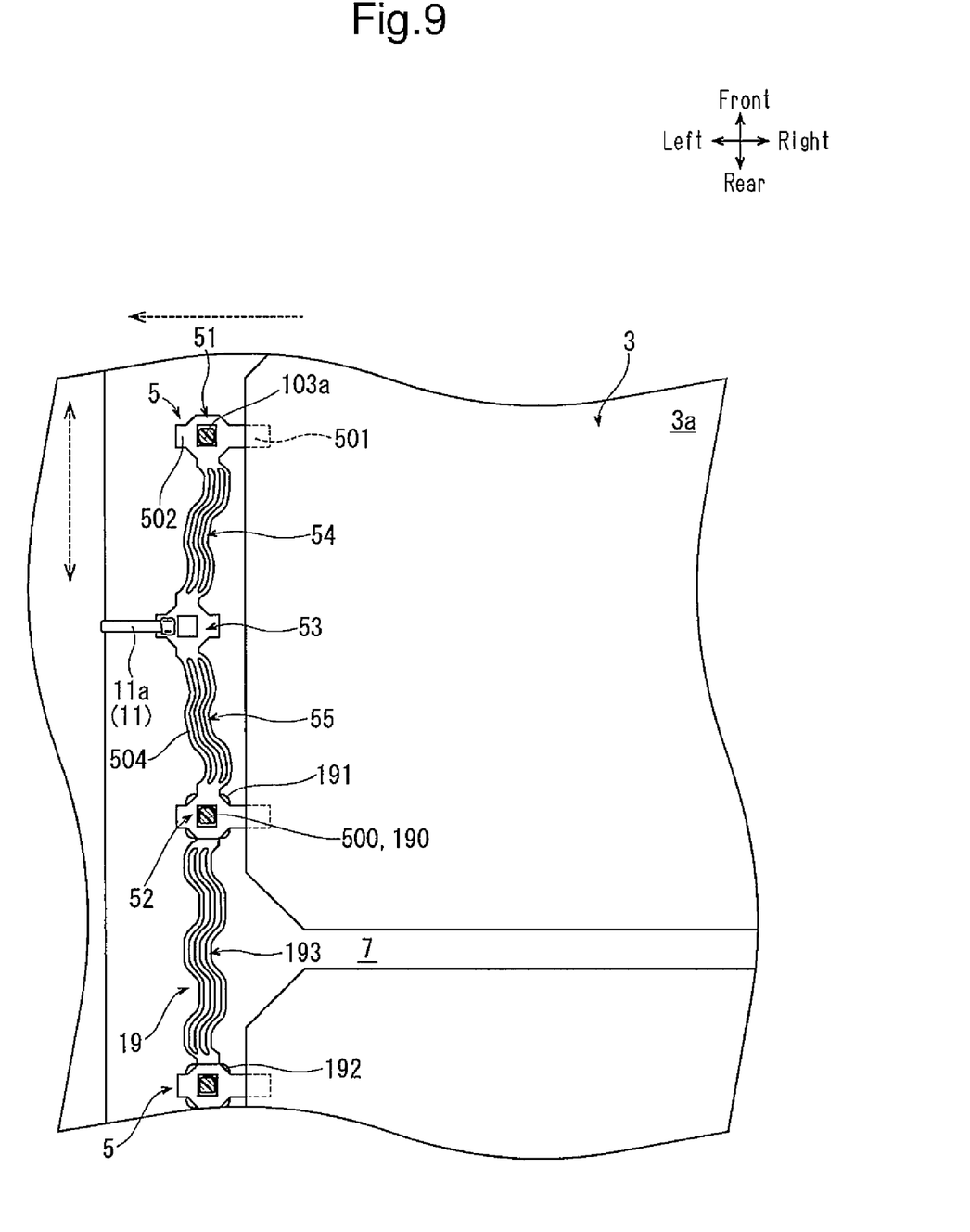
FIG. 9 is an enlarged cross-sectional view of a solar panel according to a third embodiment that is the same as FIG. 3 when the protective cover and the back cover are thermally expanded.

As shown in FIG. 9, in a solar panel according to a third embodiment, the first to third base portions 51 to 53 do not have the interconnectors 17. Thus, in the solar panel of the third embodiment, the first and second base portions 51, 52 are directly connected to one of the solar cells 3 with first connecting sections 501. The third base portion 53 is not connected to the solar cell 3. Other structures of the solar panel of the third embodiment are the same as those of the solar panel according to the first embodiment.

In the solar panel of the third embodiment, the first and second base portions 51, 52 of each conductor 5 are directly connected to one of the solar cells 3 and secured to the protective cover 1 with the bosses 103a. Thus, the first and second base portions 51, 52 of each conductor 5 are incapable of moving with respect to the corresponding solar cell 3 in the lateral direction. In contrast, the third base portion 53 is capable of moving in the lateral direction independently from the solar cell 3. Thus, if the distal end portion 11a of the output lead 11 moves leftward away from the third base portion 53 and the solar cell 3 due to thermal expansion of the protective cover 1 and the back cover 9, each of the conductors 5 located on the left edge of the solar panel elastically deforms accordingly in such a manner that the first and second connecting portions 54, 55 bend leftward with respect to the first and second base portions 51, 52. This allows the third base portion 53 to be displaced leftward with respect to the first and second base portions 51, 52. Thus, in the solar panel of the third embodiment also, the distal end portion 11a is unlikely to peel off the third base portion 53. The conductors 5 located on the right edge of the solar panel operate in the same manner symmetrically.

Furthermore, in the solar panel of the third embodiment, since the first to third base portions 51 to 53 do not have the interconnectors 17, the configuration of the first to third base portions 51 to 53, and thus the configuration of the conductors 5, is simplified. This reduces the manufacturing costs of the solar panel. Other operations of the solar panel of the third embodiment are the same as those of the solar panel according to the first embodiment.

Although the present disclosure has been described referring to the first to third embodiments, the disclosure is not limited to the illustrated embodiments, but may be modified as necessary without departing from the scope of the disclosure.

For example, in the solar panel of the first and second embodiments, the first to third base portions 51 to 53 are connected to one of the solar cells 3 with the interconnectors 17. However, only the first and second base portions 51, 52 may be connected to one of the solar cells 3 with the interconnectors 17, and the third base portion 53 does not necessarily have to be connected to the solar cell 3.

Furthermore, in the solar panel of the first to third embodiments, the output leads 11 are provided one each at the left end and the right end of the solar panel. Instead, multiple output leads 11 may be provided at each of the left end and the right end of the solar panel.

Alternatively, in the solar panel of the first to third embodiments, the back cover 9 and the sealing member 7 may include through-holes, and the first section 111 of the extending portion 11b may be inserted in the through-holes.

The present disclosure can be used in solar panels for various solar power generation facilities besides the solar panel on vehicles.

The invention claimed is:

1. A solar panel comprising:
a plastic protective cover having light transparency allowing light to pass through from a first front surface to a first back surface;
a plastic back cover;
a solar cell,
a conductor, which is arranged next to the solar cell in a first direction and is connected to the solar cell to permit electricity to flow therebetween, wherein the first direction is a lateral direction of the solar cell that is perpendicular to a thickness direction of the solar cell, wherein the thickness direction of the solar cell extends in an up and down direction of the solar cell;
a sealing member, which retains the solar cell and the conductor between the protective cover and the back cover in a sealed state; and
a plurality of output leads configured to transmit electricity generated by the solar cell, wherein
the back cover includes a second front surface joined to the sealing member and a second back surface located on an opposite side to the second front surface,
the conductor includes
a first base portion, which is secured to at least one of the protective cover and the back cover, is arranged next to the solar cell in the first direction, and is connected to the solar cell,
a second base portion, which is located at position away from the first base portion in a second direction, which intersects the first direction, is secure to at least one of the protective cover and the back cover is arranged next to the solar cell in the first direction and is connected to the solar cell,
a third base portion located between the first base portion and the second base portion,
a first connecting portion, which is located between the first base portion and the third base portion and connects the first base portion to the third base portion, and
a second connecting portion, which is located between the second base portion and the third base portion and connects the second base portion to the third base portion,
each output lead includes
a distal end portion, which extends in the first direction along the second front surface and is connected to the third base portion from a side opposite from the solar cell, and
an extending portion, which is continuous with the distal end portion and extends in the first direction toward the solar cell along the second back surface,
at least part of the extending portion is secured to the second back surface, and
each of the first connecting portion and the second connecting portion is elastically deformable in the first and second directions,
wherein the first connecting portion and the second connecting portion are each configured by a plurality of connecting bodies arranged spaced apart from each other, and
the plurality of connecting bodies of the first connecting portion curves in a manner resembling a lateral waveform with a constant amplitude along the second direction and extends between the first base portion and the third base portion, and
the plurality of connecting bodies of the second connecting portion curves in a manner resembling a lateral waveform with a constant amplitude along the second direction and extends between the second base portion and the third base portion.

2. The solar panel according to claim 1, wherein
the first base portion and the second base portion each include an interconnector connected to the solar cell, and
the interconnectors are deformable in the first direction.

3. The solar panel according to claim 2, wherein the interconnectors include an annular connecting portion having a dimension in the second direction greater than a dimension in the first direction.

4. A solar panel comprising:
a plastic protective cover having light transparency allowing light to pass through from a first front surface to a first back surface;
a plastic back cover;
a solar cell;
a conductor, which is arranged next to the solar cell in a first direction and is connected to the solar cell to permit electricity to flow therebetween, wherein the first direction is a lateral direction of the solar cell that is perpendicular to a thickness direction of the solar cell, wherein the thickness direction of the solar cell extends in an up and down direction of the solar cell;

a sealing member, which retains the solar cell and the conductor between the protective cover and the back cover in a sealed state; and an output lead configured to transmit electricity generated by the solar cell, wherein the back cover includes a second front surface joined to the sealing member and a second back surface located on an opposite side to the second front surface, the solar cell is secured to at least one of the protective cover and the back cover, the conductor includes
- a first base portion, which is arranged next to the solar cell in the first direction and is connected to the solar cell,
- a second base portion, which is located at a position away from the first base portion in a second direction, which intersects the first direction, is arranged next to the solar cell in the first direction, and is connected to the solar cell,
- a third base portion located between the first base portion and the second base portion,
- a first connecting portion, which is located between the first base portion and the third base portion and connects the first base portion to the third base portion, and
- a second connecting portion, which is located between the second base portion and the third base portion and connects the second base portion to the third base portion, the output lead includes
- a distal end portion, which extends in the first direction along the second front surface and is connected to the third base portion from a side opposite from the solar cell, and
- an extending portion, which is continuous with the distal end portion and extends in the first direction toward the solar cell along the second back surface, at least part of the extending portion is secured to the second back surface, and each of the first connecting portion and the second connecting portion is elastically deformable in the first and second directions, wherein the first connecting portion and the second connecting portion are each configured by a plurality of connecting bodies arranged spaced apart from each other, and the plurality of connecting bodies of the first connecting portion curves in a manner resembling a lateral waveform with a constant amplitude along the second direction and extends between the first base portion and the third base portion, and the plurality of connecting bodies of the second connecting portion curves in a manner resembling a lateral waveform with a constant amplitude along the second direction and extends between the second base portion and the third base portion.

5. The solar panel according to claim 4, wherein
the first base portion and the second base portion each include an interconnector connected to the solar cell, and the interconnectors are deformable in the first direction.

6. The solar panel according to claim 5, wherein the interconnectors include an annular connecting portion having a dimension in the second direction greater than a dimension in the first direction.

* * * * *